United States Patent [19]
Harris

[11] Patent Number: 4,870,374
[45] Date of Patent: Sep. 26, 1989

[54] MODULATOR PRODUCING PHASE MODULATION BY COMBINING AMPLITUDE MODULATED SIGNALS

[75] Inventor: Mark A. Harris, Clearwater, Fla.

[73] Assignee: E-Systems, Inc., Dallas, Tex.

[21] Appl. No.: 181,052

[22] Filed: Apr. 13, 1988

[51] Int. Cl.[4] ............................ H03C 3/24; H03C 3/40
[52] U.S. Cl. ........................................ 332/145; 332/174
[58] Field of Search .................. 332/23 A, 23 R, 21, 332/22; 455/42, 102, 110, 126; 333/156, 164

[56] References Cited

U.S. PATENT DOCUMENTS

| | | | |
|---|---|---|---|
| 2,238,249 | 4/1941 | Crosby | 332/23 A |
| 3,644,831 | 2/1972 | Latker et al. | 332/16 R X |
| 3,789,302 | 1/1974 | Rearwin et al. | 332/19 X |
| 3,810,018 | 5/1974 | Stover | 332/18 X |
| 3,818,135 | 6/1974 | Tannhauser | 332/16 R X |
| 4,027,274 | 5/1977 | Fukui et al. | 332/19 |
| 4,168,397 | 9/1979 | Bradley | 332/16 R X |
| 4,213,094 | 7/1980 | Wood | 332/21 X |
| 4,344,185 | 8/1982 | Cook et al. | 332/23 A X |
| 4,359,779 | 11/1982 | Levine | 332/18 X |
| 4,367,444 | 1/1983 | Gardner et al. | 332/19 |
| 4,549,152 | 10/1985 | Kumar | 332/23 R |

FOREIGN PATENT DOCUMENTS 2363214 7/1975 Fed. Rep. of Germany ... 332/23 A

OTHER PUBLICATIONS

Selin, "Continuously Variable L-Band Monolithic GaAs Phase Shifter", Microwave Journal, Sep. 1987, pp. 211–217.

Kumar et al., "Broad-Band Active Phase Shifter Using Dual-Gate MESFET" IEEE Trans. Microwave Theory and Techniques, vol. MTT-29, No. 10, pp. 1098–1102.

Primary Examiner—Siegfried H. Grimm
Attorney, Agent, or Firm—Albert M. Crowder, Jr.

[57] ABSTRACT

A system is described for using the modulation of the phase of a RF carrier as means of transmitting information. The RF input is split into four quadrature components each of which is passed through individual amplitude control attenuators and then summed in a combiner to create the required phase-controlled RF signal. The resultant signal is then amplified in an RF signal amplifier chain as required to achieve the desired output level. The RF output level is sampled and routed back to an in-phase splitter the output of which is compared to the corresponding individual quadrature components of the unmodulated RF signal to generate a signal which is compared with a processor generated modulation reference signal in a control loop amplifier and the resulting error signal is applied to the individual attenuators to adjust the output amplitude of each quadrature component. The quadrature components are then combined to obtain the desired phase-modulated RF output signal.

20 Claims, 2 Drawing Sheets

PHASES ARE RELATIVE, NOT ABSOLUTE

MODULATOR PRODUCING PHASE MODULATION BY COMBINING AMPLITUDE MODULATED SIGNALS

BACKGROUND OF THE INVENTION

The present invention relates generally to communication systems which use the modulation of the phase of an RF carrier as a means of transmitting information. In particular, the invention relates to an analog phase modulation scheme as an RF signal generation phase-control system.

BACKGROUND OF THE INVENTION

Many communications systems use the modulation of the phase of an RF carrier as a means of transmitting information. In analog phase modulation schemes, precise control of the carrier phase is necessary to prevent spectrum splatter and the spectrum occupancy must be controlled to prevent subsequent adjacent channel interference. Both the absolute phase and the phase change characteristics such as rate of change and linearity are important perameters to achieve the desired RF performance.

Typical RF signal generation phase-control systems use an open-loop technique where the phase of the carrier is controlled at a small-signal level and the resultant is amplified to the desired output. The phase-control takes place using linear phase modulators either at the desired output frequency or at an intermediate frequency that is translated using mixing schemes to the final output RF frequency. Precise control of the output is limited by the accuracy of the control element, and even though some systems use correction techniques such as look-up tables, the system operates with limited control of the phase accuracy. The use of mixers in wide-band systems results in the generation of undesirable spurious products that have to be filtered with expensive tuned filters. Other schemes exist where the phase is controlled with a synthesizer control feedback loop to directly modulate the final RF frequency through digital phase-shifts in the synthesizer divider chain. However, these schemes must carefully trade off the tuning speed response times available with the modulation bandwidths and rates required and are best suited to digital phase-shift increments rather than analog systems.

When the phase-modulated RF signal is amplified to the desired output level, non-linearities in the RF amplifiers result in amplitude-to-phase conversion that distorts the output signal. Modulation schemes that contain significant amplitude modulation (such as PSK) will generate significant errors when passed through high power RF transmitter amplifiers. The impact of these additional system errors results in communications performance that is less than ideal and impacts many users through electromagnetic compatibility problems such as the spectrum splatter and adjacent channel interference problems mentioned earlier.

The present invention is intended to provide a more accurate modulation technique by controlling the phase of an RF signal with an analog phase modulation scheme which is compatible with operation over a wide RF band without requiring mixing schemes. The preferred embodiment of the invention operates with four high gain feedback loops which compare the RF phase of the signal at the system or transmitter output with the desired output phase and is based on an in-phase (I) and quadrature (Q) component system with the reference analog baseband signals being generated using digital signal processing techniques. The digital processing methods also provide a means of correcting errors in the reference generation system.

The input RF carrier signal is split into quadrature component signals, I and Q, and the amplitude of the direct and inverted phase of the quadrature signals is adjusted to a desired level. When the direct and inverted quadrature signals are combined, the resulting signal determines the phase of the RF carrier in the quadrant formed by the direct and inverted phase signals. By using four feedback loops with the input RF carrier being split into four quadrature component signals, $|I|$, $|\bar{I}|$, $|Q|$ and $|\bar{Q}|$, (hereafter listed as I, $\bar{I}$, Q, $\bar{Q}$) and by adjusting any two of the direct and inverted quadrature component signals to a desired amplitude and the remaining two direct and inverted quadrature components to "0," the phase of the output signal can be shifted to any desired phase angle simply by combining all four components to produce the desired output signal. By sampling the desired output and comparing the sampled output with each input quadrature component, any phase errors between the input and the output in any loop can be detected and fed into a differential amplifier which compares the analog baseband modulation signal with the error signal developed and generates an output signal which adjusts the amplitude of the RF signal in a particular loop to introduce a phase correction for the error that may exist in that loop.

When all four quadrature components are combined, two of which would be zero and two of which represent the desired phase angle, the desired phase-modulated RF output signal is generated. An analog modulation signal can be applied to the differential amplifier which controls the attenuation of each of the quadrature loops. Further this analog modulation signal, with the use of a digital signal processing techniques and a digital-to-analog converter, can be generated digitally, converted to analog and applied to the circuit as an analog phase modulation signal.

By placing an amplifier at the output of the combiner, only one amplifier needs to be used instead of four as in another embodiment where the amplifiers are placed in each of the quadrature phase loops. In addition, phase correction is performed using the final output phase modulated signal so that errors in the output combiner are now within the loop for correction. Finally, if the amplifier is positioned at the output of the combiner, it does not drive a high loss component such as the combiner, so efficiency is maintained.

Thus, the present invention provides apparatus for analog phase modulation of an RF signal.

The invention also provides an analog phase modulator which operates on the output frequency directly and eliminates the need to modulate the signal at a different fixed frequency and then mix it to the desired frequency.

The invention further relates to a phase amplitude modulation system which is applicable to operation over a wide operating frequency band limited only by the performance of the RF signal phase splitters.

The invention also provides an extension of the operating frequency band of the system by digitally compensating for known errors at the analog baseband modulating input.

The invention further relates to an analog phase modulation system which utilizes feedback control techniques to insure accurate reproduction of the output signal.

The invention additionally provides an analog phase modulation system which utilizes a control loop that operates only on signal amplitudes to control the output signal phase angle.

In addition, the invention provides an RF phase modulation system in which the control loop is an analog system rather than a digital system and is therefore useful in analog modulation systems such as FM (frequency modulation) voice.

SUMMARY OF THE INVENTION

In accordance with the present invention there is provided an RF carrier signal phase modulator comprising means for splitting an input RF carrier signal into quadrature component signals, analog means coupled to the signal splitting means for establishing a predetermined signal amplitude of each of the quadrature component signals between zero and a maximum, and means for combining the amplitude established quadrature component signals to generate a phase-modulated RF carrier output signal.

Also, in accordance with the present invention, there is provided a method of generating a phase-modulated RF carrier signal comprising the steps of splitting an input RF carrier signal into quadrature component signals, coupling analog signals to the splitting means for establishing a predetermined signal amplitude of each of the quadrature component signals between zero and maximum, and combining the amplitude established quadrature signals to generate a phase-modulated RF carrier output signal.

BRIEF DESCRIPTION OF THE DRAWINGS

For a more complete understanding of the present invention and the advantages thereof, reference is now made to the following description taken in conjunction with the accompanying drawings.

Referring to the drawings.

DETAILED DESCRIPTION OF THE DRAWINGS

It is well known that if any two orthogonal vectors are combined, a resultant vector is obtained whose angle and magnitude are dependent upon the magnitude of the respective quadrature component signals. Thus, considering FIG. 1, where the vector I represents an in-phase component, vector Q represents the quadrature component, vector $\bar{I}$ represents the negative in-phase component, and $\bar{Q}$ represents the negative quadrature component, it can be seen that if vector A, the Q component and vector B, the $\bar{I}$ component are combined, an arbitrary output vector 10 is obtained at an angle θ with respect to the I vector.

Figure 1:
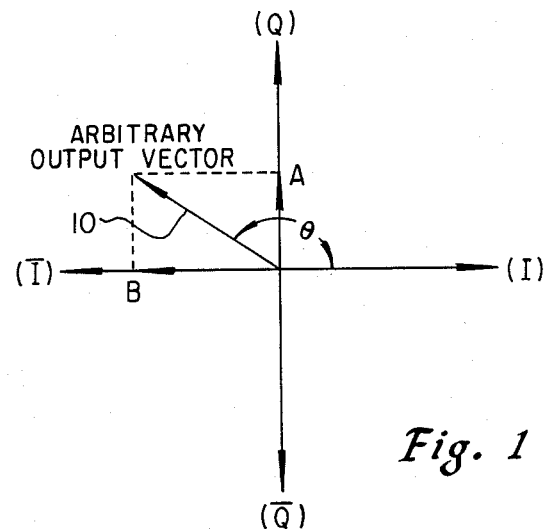
FIG. 1 is a diagram of the modulator coordinate system.

It is obvious from this diagram that if vectors I and Q are combined, a resultant vector will be obtained in the first quadrant which is the upper righthand quadrant of FIG. 1. If the vectors $\bar{I}$ and $\bar{Q}$ are combined, the resultant output vector will have a phase angle in the third quadrant or the lower left quadrant. Finally, if the I and $\bar{Q}$ vectors are combined, the resultant output vector will be in the fourth or lower right quadrant. Utilizing this summation of vectors, the present invention provides apparatus to phase modulate an RF carrier with an analog input signal.

Figure 2:
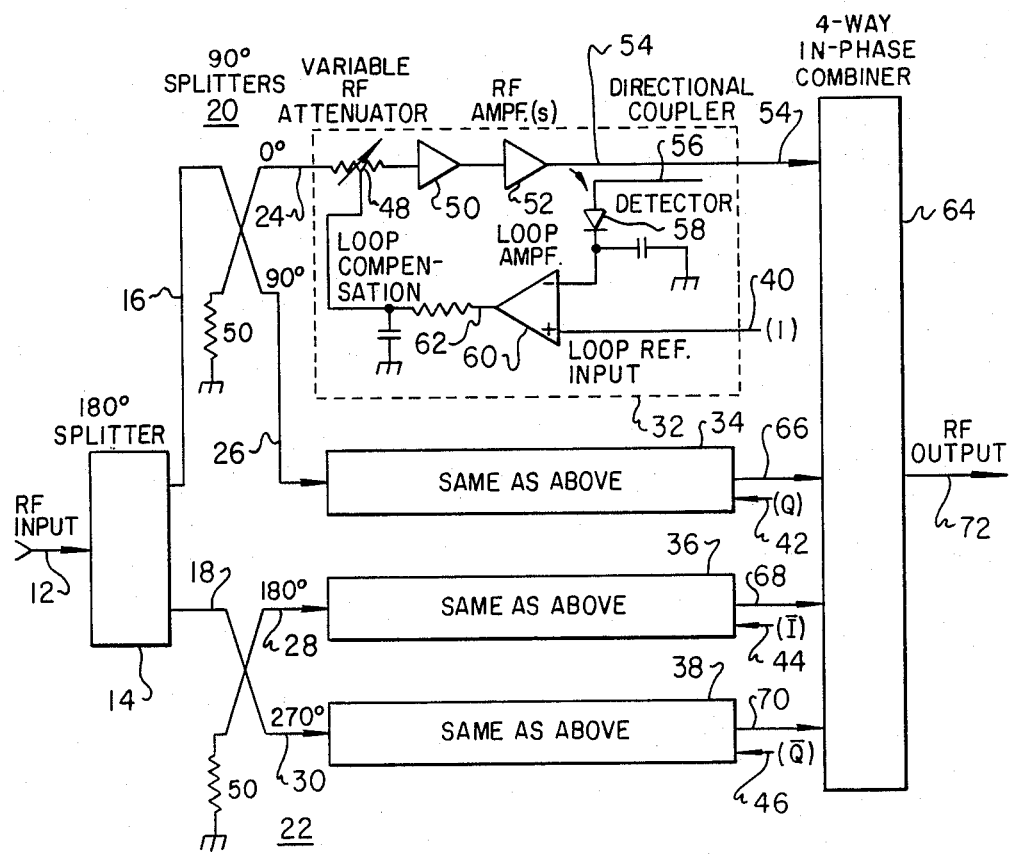
FIG. 2 is a schematic diagram of one embodiment of the analog phase modulator.

One such analog phase modulator is illustrated in FIG. 2. The RF input signal on line 12 is coupled to a 180° splitter 14 generating outputs on lines 16 and 18 which are at 90° and 270° respectively and thus are separated by 180°. The 90° output signal on line 16 is coupled to a 90° phase splitter 20 to produce a 0° signal on line 24 and a 90° signal on line 26. In a like manner, the output signal on line 18 is coupled to a 90° splitter 22 generating a 180° output signal on line 28 and a 270° output signal on line 30. Each of these signals on lines 24, 26, 28 and 30 is coupled to a respective analog amplitude modulator, 32, 34, 36 and 38. Since these modulators are substantially similar, only the one designated by the numeral 32 will be disclosed in detail.

It will be noted that these modulators receive the modulation input signal on lines 40, 42, 44 and 46, respectively, which are amplitude control signals and correspond to the loop to which they are connected. Thus the 0° loop, which has a 0° signal on line 24 into the analog phase modulator 32, has an analog modulation signal I on line 40. It will be remembered from FIG. 1 that the I vector is at 0°. In a like manner, the reference input signal on line 42 is a Q signal which controls the amplitude of the 90° quadrature signal shown in FIG. 1 and is coupled to modulator 34 which receives the 90° quadrature input signal on line 26. Also, the $\bar{I}$ amplitude control signal on line 44 is coupled to modulator 36 which receives the 180° phase-shift signal on line 28 and the $\bar{Q}$ amplitude control signal on line 46 is coupled to modulator unit 36 which receives the 270° phase-shift input signal on line 30.

The amplitude of each signal in each of the quadrature loops is controlled through a variable RF attenuator designated by the numeral 48 in modulator 32. Each of the other modulators 34, 36 and 38 has the amplitude of the signal applied thereto adjusted in like manner. The signal from the variable RF attenuator 48 is coupled to series RF amplifiers 50 and 52 to drive the output level on line 54 to a value demanded by the I reference signal on line 40 (the analog modulation input signal) within the control accuracy of the feedback loop.

The amplitude control feedback loop consists of directional coupler 56, detector 58, and loop amplifier 60 whose output is coupled to the variable RF attenuator 48. The directional coupler 56, of course, samples the amplitude adjusted output signal on line 58 and couples it through diode or detector 58 to the loop amplifier 60 as one input. The other input to loop amplifier 60 on line 40 is the I quadrature amplitude control signal or analog modulation signal. The loop amplifier 60 compares the amplitude of the sensed output signal from the directional coupler to the reference signal on line 40 and generates a resulting error voltage on line 62 which is used to control the RF attenuator 48 to drive the output signal level on line 54 to that which is desired.

Suppose that it is desired to modulate the RF signal at a phase angle, θ, as shown in FIG. 1. This means that in the modulator 32, the input reference signal, I, would appear on line 40 of such magnitude as to cause loop amplifier 60 to generate an output signal on line 62 which adjusts attenuator 48 to obtain a zero output signal on line 54. Thus the signal being coupled to combiner 64 on line 54 has zero amplitude. However, the Q modulation signal on line 42 coupled to modulator 34 drives the output of modulator 34 on line 66 to the amplitude A shown in FIG. 1. In a like manner, the $\bar{\text{I}}$ modulation input signal on line 44 to modulator 36 adjusts the attenuator in modulator 36 to cause the output signal on line 68 to have an amplitude represented by the vector B in FIG. 1. Also, the $\bar{\text{Q}}$ reference signal on line 46 to modulator 38 is of such magnitude as to cause the output of modulator 38 on line 70 to be driven to zero. RF combiner 64 is a four-way in-phase combiner which combines the four signals present (only two of which have amplitudes on line 66 and 68 respectively) to obtain the resultant phase-shifted RF output on line 72.

Figure 3:
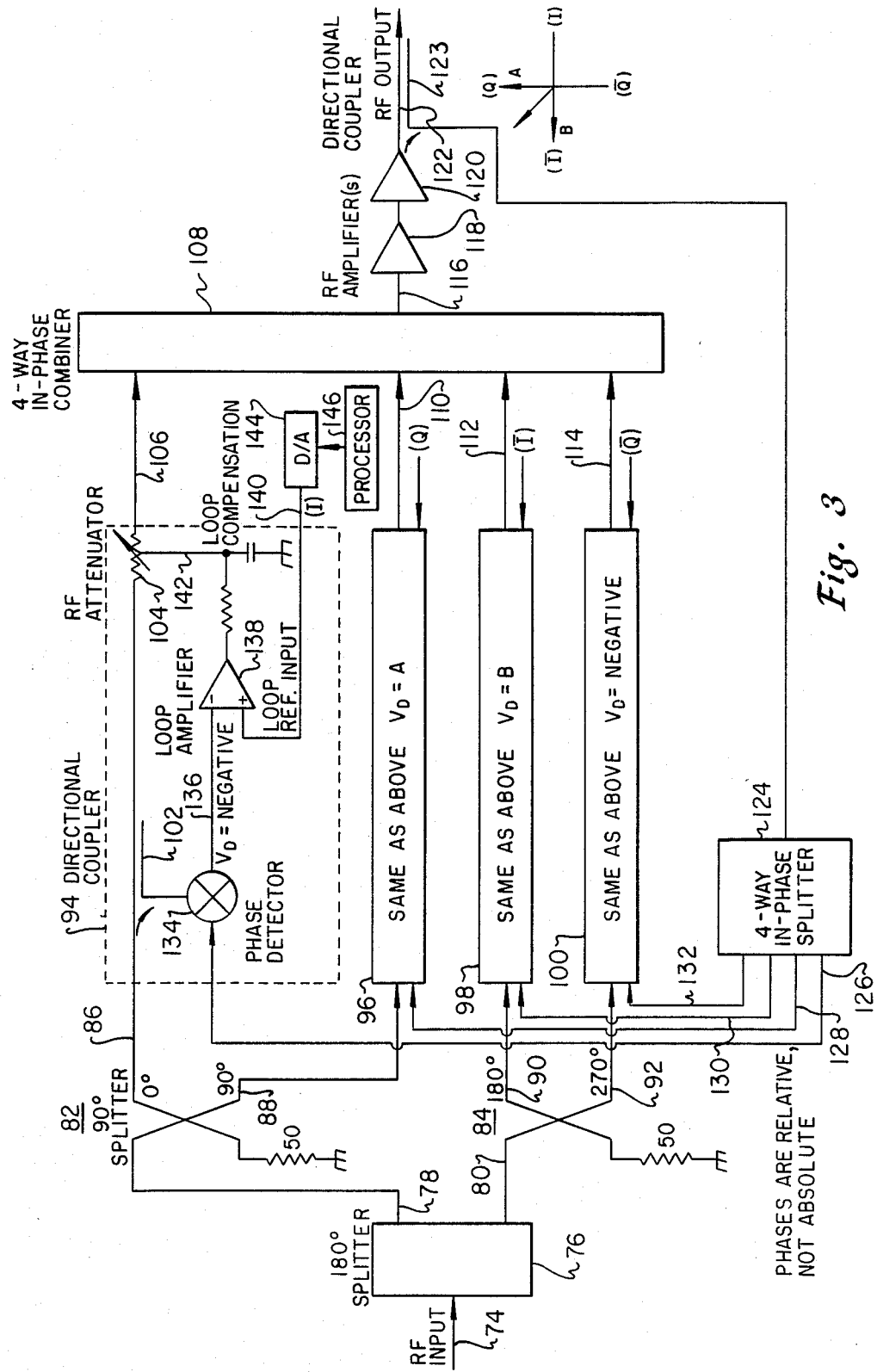
FIG. 3 is a schematic diagram of the preferred embodiment of the analog phase signal modulator.

Referring to FIG. 3, there is shown a preferred embodiment of the modulator where the RF input signal on line 74 is coupled to a 180° phase splitter which generates 180° spaced outputs on lines 78 and 80. Again, the signal on line 78 is coupled to a 90° phase splitter 82 while the signal on line 80 is coupled to a 90° phase splitter 84. The output of phase splitter 82 is a signal at 0° on line 86 and a signal at 90° on line 88. In a like manner, the output of 90° splitter 84 on line 90 is a signal at 180° while the output on line 92 is a signal at 270°. These signals are again coupled to their respective modulator designated by the numerals 94, 96, 98 and 100. Only the details of modulator 94 are disclosed since the details of modulators 96, 98 and 100 are similar.

Again, the 0° signal on line 86 is coupled to modulator 94 which has a directional coupler 102 where the input signal is sampled prior to modulation. The output of the directional coupler passes to RF attenuator 104 which adjusts the amplitude of the signal. The output of the modulator 94 on line 106 is coupled to the four-way in-phase combiner 108 which combines the outputs of the four modulators 94, 96, 98 and 100 on lines 106, 110, 112 and 114, respectively, to generate an RF output signal on line 116 which is phase-modulated. This signal is coupled through amplifiers 118 and 120 which generate the desired phase-modulated output signal on line 122. Thus each quadrature component of the output RF signal is passed through individual amplitude control attenuators 104 and then summed in combiner 108 to create the required phase-modulated RF output signal on line 122. It will be noted in FIG. 3 that a single RF amplifier chain consisting of amplifiers 118 and 120 is required to achieve the desired output level.

Directional coupler 123 samples the phase-modulated RF output signal on line 122 and couples it back to a four-way in-phase splitter 124 which generates the RF output signal on each of the lines 126, 128, 130 and 132. These output signals are coupled to phase detector 134 in each of the modulators 94, 96, 98 and 100 where the sampled output signal is compared to the individual quadrature component of the input signal through directional coupler 102. Phase detector 134 generates an output signal which is a voltage the magnitude of which is proportional to the phase difference between the two signals into the phase detector 134 and the sign of which is proportional to the phase direction. Thus, any phase errors which may have developed through the 18° phase splitter 76, the two 90° phase splitters 82 and 84 and the output combiner 108 are within the loop and are inherently corrected. The output signal of the mixer or detector 134 on line 136 is coupled to loop amplifier 138 for comparison with the modulation input reference analog signal on line 140. The resulting error signal on line 142 is utilized to adjust the RF attenuator 104 to cause the RF signal amplitude on line 106 to be the desired level. Note that when a negative signal is generated on line 136 by the mixer or phase detector 134, the control loop amplifier 138 output on line 142 is driven negative thus driving the associated attenuator to zero output as desired.

In summary, the detected amplitude error signal on line 136 is compared with the analog modulation reference signal on line 140 by control loop amplifier 138 and the error output signal on line 142 is applied to the individual attenuator 104 to adjust the output signal amplitude. Phase correction is therefore made. within the gain and bandwdth capability of the amplitude control loop and the RF quadrature signals are control referenced to the system output to remove distortion errors as desired.

An advantage of the Quadraloop Modulator shown in FIG. 3 is that (1) the output amplifier does not drive a high loss component so efficiency is maintained, (2) phase correction is performed at the output so that errors in the phase splitters and in the output combiner 108 are now within the loop for correction and (3) a single output amplifier is now required.

It is well known that errors occur in the phase split of the input RF signals to create 0°, 90°, 180° and 270° phase reference signals for the phase detectors. For wide RF band coverage applications, these errors are typically limited to only several degrees in creating the desired coordinate system with transmission line based components. For example, for 225 to 400 MHz operation, the 90° hybrid splits the signal with phase accuracies of $+/-2°$ over the band. Similar performances are obtained by the 180° splitter. Because of the manner in which these components are fabricated, the phase errors are predictable and can be programmed out with the present invention by generating appropriate offsets in the digital signal processor 146 that generates the analog baseband modulating signal on line 140 through a digital-to-analog converter 144.

The response times and accuracies of the modulator are determined by the open loop gain and bandwidth characteristics of the control loop. As with any loop, as long as the loop is significantly faster than the reference signal applied, the reference will be accurately reproduced. Therefore, any shaping or other signal processing can be performed at baseband (audio) frequencies and will be accurately reproduced at the transmitter RF output. As an example, a control loop built around a 100 watt transmitter had an open loop gain of 110 dB at dc falling to 70 dB at 1 kHz, 40 dB at 25 kHz, 23 dB at 100 kHz and 0 dB at 1.6 MHz. Such a loop obtains very accurate phase control response to relatively high frequency modulation inputs. For example, 60 dB of open loop gain and 0 dB of closed loop gain results in only a 0.017 dB of error in the two vectors creating the output and 100 dB of gain results in 0.0002 dB error. Combined with a 12-bit digital-to-analog converter to generate the reference signals (an additional 0.002 dB quantization error), a total phase accuracy of 0.125° at 45° (with 60 dB gain) is achieved.

Thus, there has been disclosed embodiments of a Quadraloop Modulator which have several desirable characteristics in the generation of phase-modulated RF signals. In the preferred embodiment, the modulator operates on the output frequency directly and eliminates the need to modulate a signal at a different fixed frequency which would then have to be mixed to the desired frequency. The invention is applicable to operation over a wide operating band of frequencies limited only by the performance of the RF signal phase splitters. Digital compensation of known errors at the baseband modulating input extends the operating band of the system. Feedback control techniques are used to insure accurate reproduction of the output signal and the control loop operates only on signal amplitudes to control the output phase. The control loop is also an analog system rather than a digital system and is therefore useful in analog modulation systems such as FM (frequency modulation) voice. By sampling the feedback signal at the output of the transmitter, AM-PM distortion effects on the non-linear amplifiers are included within the control loop and are therefore corrected to improve modulation performance.

While the invention has been described in connection with a preferred embodiment, it is not intended to limit the scope of the invention to the particular form set forth, but, on the contrary, it is intended to cover such alternatives, modifications, and equivalence as may be included within the spirit and scope of the invention as defined in the appended claims.

I claim:

1. A phase modulator for an RF carrier signal comprising:
   means for splitting the RF carrier signal into at least two quadrature component signals;
   a corresponding variable RF attenuator for receiving each quadrature component signal;
   means for generating an analog modulation signal for each quadrature component signal;
   a directional coupler for sampling the amplitude of each quadrature component signal;
   means for adjusting the amplitude of each quadrature component signal by comparing each modulation signal with the sampled amplitude of the corresponding quadrature component signal to generate an amplitude control signal for adjusting each of the corresponding attenuators; and
   means for vectorially combining said amplitude adjusted quadrature component signals to generate a phase-modulated RF carrier output signal.

2. A phase modulator as in claim 1 wherein said quadrature signal amplitude adjusting means further comprises:
   a loop differential amplifier for comparing the amplitude of a sampled quadrature component signal with a corresponding modulation signal to generate a difference output signal; and
   means coupling the difference output signal to the variable RF attenuator to adjust the attenuator to cause said sampled output RF quadrature signal to have an amplitude established by the modulation signal.

3. A phase modulator as in claim 2 wherein each modulation signal is digitally generated through a digital-to-analog converter.

4. A phased modulator as in claim 2 wherein said modulation signal is an analog baseband signal.

5. A phase modulator as in claim 1 wherein said carrier signal phase splitting means generates four quadrature component signals with a 180° splitter and two 90° splitters.

6. A phase modulator as in claim 1 wherein said analog means for adjusting said attenuators comprises:
   means for generating said analog modulation signal as an input reference signal for each of the quadrature component signals;
   said directional coupler being positioned between the variable attenuator and the combining means for sampling the amplitude of the RF carrier quadrature component signal; and
   a differential amplifier for comparing the sampled RF signal and the corresponding modulation signal and generating an output error signal for adjusting the variable attenuator to vary the amplitude of the RF carrier quadrature component signal to a level determined by the modulation signal.

7. A phase modulator as in claim 6 further comprising means coupled to the output of the variable attenuator for amplifying the adjusted level of the RF carrier quadrature component signal.

8. A phase modulator as in claim 1 wherein the means for adjusting each of the attenuators comprises:
   said directional coupler being positioned after the combining means for sensing the amplitude of the combined phase-modulated RF carrier signal;
   an in-phase splitter for receiving the RF output of the directional coupler and generating at least two corresponding phase-modulated RF signals; and
   means for coupling one of the two generated RF signals and a corresponding modulation signal to a respective corresponding one of the quadrature component signal adjusting means to generate a signal for varying the amplitude of a corresponding quadrature component signal.

9. A phase modulator as in claim 8 wherein said coupling means comprises:
   a second directional coupler for sampling the amplitude of the quadrature RF signal prior to the attenuation thereof;
   a phase detector for receiving the sampled quadrature RF signals from the second coupler and a corresponding one of the two generated RF signals from the in-phase splitter and generating an output signal whose magnitude is proportional to the phase difference between the sampled quadrature component and said one of the two generated RF signals and the sign of which is proportional to phase direction; and
   a differential amplifier for receiving and comparing the phase detector output signal with the modulation signal and generating the control signal for adjusting the attenuator.

10. A phase modulator as in claim 1 further comprising means coupled to the modulation signal generating means for compensating for any fixed, predictable phase errors generated in splitting the RF carrier into quadrature components by varying the modulation signals in opposition to the fixed phase error.

11. A method of phase modulating an RF carrier signal comprising the steps of:
   splitting the RF carrier signal into at least two quadrature component signals;
   passing each of the quadrature component signals through a corresponding variable RF attenuator;
   generating an analog modulation signal for each quadrature component signal;
   sampling the amplitude of each quadrature component signal;
   adjusting the amplitude of each quadrature component signal by comparing each modulation signal with the sampled amplitude of the corresponding quadrature component signal to generate an amplitude control signal for adjusting each of the corresponding attenuators; and vectorially combining the amplitude adjusted quadrature component signals in a signal combining means to generate a phase-modulated RF carrier output signal.

12. A method as in claim 11 wherein the step of comparing each modulation signal with a corresponding one of the quadrature component signals further comprises the steps of:

comparing the amplitude of a sampled quadrature component signal and a corresponding modulation signal in a loop differential amplifier to generate a difference output signal; and coupling the difference output signal to the variable RF attenuator to adjust the attenuator to provide an output RF signal having an amplitude established by the modulation signal.

13. A method as in claim 12 further comprising the step of digitally generating each modulation signal through a digital-to-analog converter.

14. A method as in claim 12 further comprising the step of utilizing an analog baseband signal as said modulation signal.

15. A method as in claim 11 further comprising the step of generating four quadrature component signals from said RF carrier signal utilizing a 180° splitter and two 90° splitters.

16. A method as in claim 11 wherein the step of adjusting each of said attenuators further comprises the steps of:

generating an analog modulation input reference signal for each of the quadrature component signals;

positioning a directional coupler between the variable attenuator and the combining means for sampling the amplitude of the RF carrier signal quadrature component; and comparing the sampled signal and a corresponding modulation signal in a differential amplifier to generate an output error signal for adjusting the variable attenuator to vary the amplitude of the RF carrier quadrature component signal to a level determined by the modulation signal.

17. A method as in claim 16 further comprising the step of amplifying the adjusted level of the RF carrier signal at the output of the attenuator.

18. A method as in claim 11 wherein the step of adjusting each of the attenuators further comprises the steps of:

generating said analog modulation signal as an input reference signal for each of the quadrature component signals;

positioning a directional coupler after the combining means for sensing the amplitude of the combined phase-modulated RF signal;

generating at least two corresponding phase-modulated RF signals from the RF output of the directional coupler with an in-phase splitter; and coupling one of the two generated RF signals and a corresponding modulation signal to an analog attenuator adjuster to generate a signal for varying the amplitude of a corresponding quadrature component signal.

19. A method as in claim 18 wherein the step of coupling one of the two generated RF signals and a corresponding modulation signal to an analog attenuator adjuster further comprises the steps of:

sampling the amplitude of the quadrature RF signal prior to the attenuation thereof by the attenuator with a second directional coupler;

receiving the sampled quadrature RF signal from the second coupler and a corresponding one of the two generated RF signals from the in-phase splitter in a phase detector for generating an output signal whose magnitude is proportional to the phase difference between the sampled quadrature component and said one of the two generated RF signals and the sign of which is proportional to phase direction; and receiving and comparing the phase detector output signal and the modulation signal in a differential amplifier which generates the control signal for adjusting the attenuator.

20. A method as in claim 11 further comprising the step of compensating for any fixed, predictable phase error generated in splitting the RF carrier into quadrature components by varying the modulation signal in opposition to the fixed phase error.

* * * * *